United States Patent
Nemati et al.

(10) Patent No.: US 12,484,122 B2
(45) Date of Patent: Nov. 25, 2025

(54) CONTROL AND/OR REGULATING SYSTEM, CIRCUIT ARRANGEMENT AND METHOD FOR ACTUATING LIGHT-EMITTING DIODES (LEDs) IN AN LED FIELD

(71) Applicant: Hella GmbH & Co. KGaA, Lippstadt (DE)

(72) Inventors: Shaham Nemati, Dortmund (DE); Dieter Nietfeld, Paderborn (DE); Bernd Schulte-Eversum, Geseke (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 201 days.

(21) Appl. No.: 18/351,224

(22) Filed: Jul. 12, 2023

(65) Prior Publication Data

US 2023/0354489 A1 Nov. 2, 2023

Related U.S. Application Data

(63) Continuation of application No. PCT/EP2022/050312, filed on Jan. 10, 2022.

(51) Int. Cl.
*H05B 45/30* (2020.01)
*H05B 45/14* (2020.01)
*H05B 45/46* (2020.01)
*H05B 45/50* (2022.01)

(52) U.S. Cl.
CPC ............. *H05B 45/14* (2020.01); *H05B 45/46* (2020.01); *H05B 45/50* (2020.01)

(58) Field of Classification Search
CPC ........ H05B 45/10; H05B 45/14; H05B 45/30; H05B 45/34; H05B 45/345; H05B 45/37; H05B 45/395; H05B 45/40; H05B 45/42; H05B 45/44; H05B 45/46; H05B 45/50; H05B 45/52; H05B 47/10
See application file for complete search history.

(56) References Cited

U.S. PATENT DOCUMENTS

| | | | |
|---|---|---|---|
| 10,178,734 B1 | 1/2019 | Moumen et al. | |
| 2006/0082332 A1 | 4/2006 | Ito et al. | |
| 2015/0022112 A1* | 1/2015 | Nietfeld | H05B 45/46 315/210 |
| 2016/0353546 A1 | 12/2016 | Hente | |
| 2020/0187323 A1 | 6/2020 | Pamato et al. | |

FOREIGN PATENT DOCUMENTS

WO 2012072629 A2 6/2012

* cited by examiner

*Primary Examiner* — Long Nguyen
(74) *Attorney, Agent, or Firm* — Husch Blackwell LLP

(57) ABSTRACT

A method is provided for operating a control and/or regulating system for a light emitting diode field. At least two first outputs are provided at which control signals for controlling controllable switch elements of the light emitting diode field are tapped. A second output is provided at which control and/or regulating signals for controlling and/or regulating a controllable and/or regulatable power source is tapped. The voltage drop across the light emitting diode field is measured by the first voltage sensor, and when the control and/or regulating signal of the control and/or regulating system falls below a designated voltage value, the controllable and/or regulatable power source is switched off. A constant sensor signal is present at the at least one measuring signal input, and the sensor signal is larger than the designated voltage value.

8 Claims, 1 Drawing Sheet

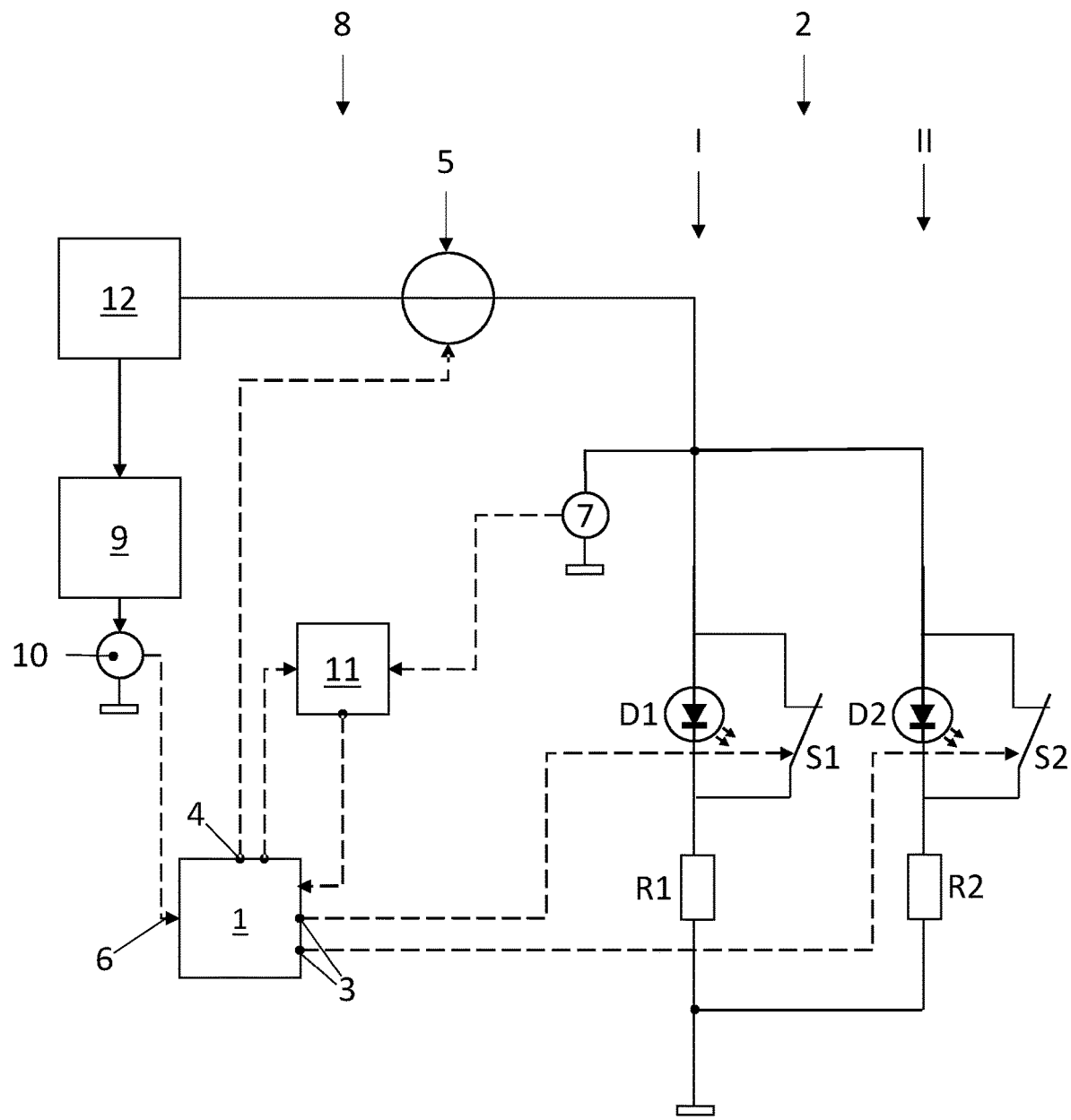

CONTROL AND/OR REGULATING SYSTEM, CIRCUIT ARRANGEMENT AND METHOD FOR ACTUATING LIGHT-EMITTING DIODES (LEDs) IN AN LED FIELD

CROSS REFERENCE

This application claims priority to PCT Application No. PCT/EP2022/050312, filed Jan. 10, 2022, which itself claims priority to German Application No. 10 2021 100854.9, filed Jan. 18, 2021, the entireties of both of which are hereby incorporated by reference.

FIELD OF THE INVENTION

The invention relates to a control and/or regulating system for a light emitting diode field. A circuit arrangement and a method for operating the circuit arrangement.

BACKGROUND OF THE INVENTION

Light-emitting diode fields consisting of a large number of light-emitting diodes are currently replacing traditional bulbs in headlamps of modern motor vehicles. Light-emitting diodes not only offer a high level of luminous efficiency and increased safety but also many design freedoms and great potential for energy savings. Alongside creative light concepts, innovative developments offer the possibility of generating different light distributions, e.g. for urban or rural roads, poor weather or highway light. For this purpose, it is necessary for the luminance and the light output of the individual light-emitting diodes or from several light-emitting diodes combined into a group in the light-emitting diode field can be actuated precisely.

To this end, it is necessary to reduce or dim the luminance values of the light-emitting diodes. One option to influence the luminance values of the light-emitting diodes is pulse width modulation in which the luminance values are adjusted by means of clocked switching on and off of the light-emitting diodes within a clock cycle. This is usually performed with a constant current pulse amplitude.

Usually, actuation of the individual light emitting diodes involves the use of components that have various integrated diagnostic functions. An integrated diagnostic function can, for example, consist of detecting a short circuit at one or more light emitting diodes of the light emitting diode field. Such a short circuit indicates that the light emitting diode in question is defective. For the purpose of integrated short circuit detection, the drop in voltage across a light emitting diode or a group of light emitting diodes of the light emitting diode field is measured and compared to a specified threshold value. The voltage falling below the threshold value is deemed to be a short circuit and the power supply to the light emitting diodes is switched off. Other defects or failures may also occur in a light emitting diode field and be detected by a drop in voltage deviating from the drop in voltage in fault-free operation.

When adjusting the luminance values using pulse width modulation, such integrated short-circuit detection proved to be disadvantageous. If it is not possible at low luminance values to leave at least one LED switched on over the entire clock cycle, there is the possibility that the measured drop in voltage across the light emitting diodes falls below the threshold value for short-circuit detection without there being an actual short circuit. The power supply to the light emitting diodes is interrupted automatically in such a case. If at least one light emitting diode is switched on again in one of the following clock cycles, it will be necessary to first put the power source into operation again. This can lead to a time delay in the actuation of the individual light emitting diodes. Optically, such a delay time may appear to an observer as a flickering. Flickering of this kind is unwanted in many cases.

BRIEF SUMMARY OF THE INVENTION

This is the point at which the invention comes in.

The problem underlying the invention involved improving the known actuation of the light emitting diode field in such a way as to avoid erroneous detection of short circuits within the light emitting diode field and a flickering of the light emitting diodes following erroneous detection of a short circuit.

The invention solves this issue through the inventive operation of a control and/or regulating system for a light emitting diode field, where the control and/or regulating system features at least two first outputs at which control signals for controlling controllable switch elements of the light emitting diode field can be tapped, a second output at which control and/or regulating signals for controlling and/or regulating a controllable and/or regulatable power source can be tapped, at least one measuring signal at which sensor signals from at least one first voltage sensor can be applied, where the voltage drop across the light emitting diode field can be measured by means of the first voltage sensor and in the event of the control and/or regulating signal of the control and/or regulating system falling below a designated voltage value the controllable and/or regulatable power source can be switched off, where a constant sensor signal is present at the at least one measuring signal input, where the sensor signal is larger than the designated voltage value.

With regard to the circuit arrangement, the task is solved by the circuit arrangement featuring at least one voltage source, where a second voltage sensor the output of which is connected to the at least one measuring signal input of the control and/or regulating system, transfers the drop in voltage of the one voltage source at the measuring signal input the voltage source supplying a voltage signal that is larger than the designated voltage value at which the control and/or regulating system switches off the controllable and/or regulatable power source.

By applying the measuring signal of the second voltage sensor to the measuring signal input of the control and/or regulating system that displays the voltage of the one voltage source, switching off of the controllable and/or regulatable power source by the control and/or regulating signal is prevented if the voltage across the light emitting diode field falls in a clock cycle.

There is the possibility for a controllable switch element to be wired in parallel to every light emitting diode. Preferentially, the control and/or regulating system actuates each of the controllable switch elements separately and independently of each other. The controllable switch elements facilitate pulse width modulated operation of each individual light emitting diode. Preferentially, the controllable switch elements are short-circuit switches. If the short-circuit switch is actuated to close there is virtually no voltage drop at the light emitting diode. The light emitting diode is switched off. By actuating the short circuit switch there is the possibility of switching the individual light emitting diodes in the light emitting diode field on and off in such a way that a desired light distribution is created.

There is the possibility that with a desired light distribution no light emitting diode of a series connection is switched in within a clock cycle. In this case, the drop in voltage across this series connection is very small, preferentially close as possible to 0V. This minor drop in voltage across the series connection of the light emitting diode field would, in the case of a known circuit arrangement, lead to the voltage at the measuring signal input of the control and/or regulating system falls below the designated voltage value. This would be evaluated by the control and/or regulating system as a short circuit or defect in the light emitting diode and a switching-off signal would be sent to the controllable and/or regulatable power source. In the event that, due to pulse width modulation, all light emitting diodes of a series connection are switched off during a clock cycle, there is in many cases no short circuit or defect at all.

The constant sensor signal at the measuring signal input means that the voltage does not fall below the designated voltage value that leads to a switching-off of the controllable and/or regulatable power source. The misinterpretation of the voltage value as a defect is avoided in such a case.

Thanks to the voltage signal, the function of the short-circuit detection is avoided. This function is nevertheless desirable in many cases. For this reason, there is an option for the circuit arrangement to feature a detector where the detector is designed, during a clock cycle, to determine a target value for the drop in voltage for all switched-on light emitting diodes of a series connection, to detect an actual drop in voltage across the series connection, and in the event of an actual drop in voltage smaller than the target value for the drop in voltage to transfer a signal to the control and/or regulating system.

The detector is preferentially a microcontroller and/or comparator. Furthermore, a combination of both is also conceivable. It is possible that the detector does not determine the target value but the target is made known to the means of the detection, for example by the control and/or regulating system, or that the target value is known to the detector.

There is the possibility that the detector can be used to determine the drop in voltage across every series connection of the light emitting diode field separately. The detector compares the target value for the drop in voltage across the series connection that will set itself through the pulse width modulated actuation of the light emitting diodes within a clock cycle with the actual drop in voltage within a clock cycle. If there is a short circuit or defect in one or more light emitting diodes, the target value for the drop in voltage and the actual drop in voltage do not correspond to each other. Normally, the actual drop in voltage below the expected drop in voltage. In such case, the detector sends a signal to an input of the control and/or regulating system. Following on from this, the control and/or regulating system sends a signal to the controllable and/or regulatable power source in order to switch off the same. Thanks to the detector, the functionality of a short-circuit detection is nevertheless given within the control and/or regulating system which is circumvented by the constant voltage signal at the measuring signal input.

The given task is solved by a method for operating an inventive circuit arrangement, where the method features at least the following steps: the controllable switch elements are actuated by means of the control and/or regulating system for opening and/or closing, the at least one voltage source supplies a voltage signal to the second voltage sensor (10) that is greater that the designated voltage value at which the control and/or regulating system switches off the controllable and/or regulatable power source, the second voltage sensor that is connected to the at least one measuring signal input of the control and regulating system transfers the measuring signal of the drop in voltage of the one voltage source to the measuring signal input.

There is further the possibility that the detector, within a clock cycle of the preferentially pulse width modulated control and/or regulating signals, determines a target value for the drop in voltage for all switched-on light emitting diodes of a series connection, detects the actual drop in voltage across the series connection and in the event of an actual drop in voltage smaller than the target value for the drop in voltage transfers a signal to the control and/or regulating system, where after the signal has been sent to the control and/or regulating system the control and/or regulating system switches of the controllable power source.

BRIEF DESCRIPTION OF THE DRAWINGS

Reference is now made more particularly to the drawings, which illustrate the best presently known mode of carrying out the invention and wherein similar reference characters indicate the same parts throughout the views.

FIG. 1 is a block diagram of an inventive circuit arrangement.

DETAILED DESCRIPTION OF THE DRAWINGS

The inventive circuit arrangement 8 shown in FIG. 1 comprises a light emitting diode field 2 of two series connections I, II. Each series connection I, II comprises a light emitting diode D1, D2, a resistor R1, R2 and a first controllable switch element S1, S2 in parallel to the light emitting diode D1, D2. In accordance with the indexes of the designations of the components, reference will made in the following to the first series connection I and the second series connection II.

The series connections I, II are wired in parallel. Several light emitting diodes D1, D2 can be arranged in series within each series connection I, II. In such a case, a controllable switch element S1, S2 is wired in parallel for each light emitting diode D1, D2. The ends of the series connections I, II on the anode side make contact to a shared first node. The resistors R1, R2 are arranged in series to the diodes D1, D2.

Alongside the light emitting diode field 2, the circuit arrangement 8 comprises a controllable and/or regulatable power source 5 that is wired upstream of the first node. Furthermore, the circuit arrangement 8 comprises a voltage source 9. The voltage source 9 is fed, just like the controllable and/or regulatable power source 5, from the supply voltage 12 of the vehicle electrical system.

At least two voltage sensors 7, 10 are provided for in the circuit arrangement 8. The first voltage sensor 7 detects the voltage between the first node and the ground potential. The second voltage sensor 10 detects the voltage of voltage source 9.

The circuit arrangement 8 comprises a detector 11, which is connected to the first voltage sensor 7 via a first input.

Furthermore, the circuit arrangement 8 is intended to have an inventive control and/or regulating system 1. The control and/or regulating system 1 has several inputs and several outputs. Through these inputs and outputs, the control and/or regulating system 1 is connected to the regulatable power source 5, the second voltage sensor 10, the controllable switch elements S1, S2 of the light emitting diode field 2 and the detector 11.

In detail, the connections between the component parts or components and the inputs or outputs of the control and/or regulating system 1 are created as follows: A first input 6 of the control and/or regulating system 1 is connected to the second voltage sensor 10. This input 6 can be used to send a constant voltage signal to the control and/or regulating system 1. In the current state of technology, the first input 6 is used to detect the drop in voltage across the light emitting diode field 2. Thanks to the constant voltage signal, the short circuit or defect detection system integrated into the control and/or regulating system 1 is avoided that would, in the event of the voltage value falling below a specified value, send a signal to the controllable and/or regulatable power source 5 to switch it off.

A second input of the control and/or regulating system 1 is connected to the output of the detector 11. The second input can be used to send a signal to the control and/or regulating system 1 about a short circuit or defect within the light emitting diode field 2 recognized by the detector 11.

First outputs 3 of the control and/or regulating system 1 are connected to the control connectors of the controllable switch elements S1, S2 of the series connections I, II of the light emitting diode field 2. The controllable switch elements S1, S2 can be actuated by means of control pulses to open and close.

A second output of the control and/or regulating system 1 is connected to the controllable and/or regulatable power source 5. The regulatable power source 5 can be switched on and/or switched off via this second output.

A third output is connected with a second input of the detector 11. This third output can be used to transmit a signal from the control and/or regulating system 1 to the detector 11, by means of which controllable switch elements S1, S2 can be actuated within a clock period to open or close, where a closed controllable switch element S1, S2 switches off the light emitting diode D1, D2 lying in parallel to the same and an opened controllable switch element S1, S2 switches on the light emitting diode D1, D2 lying in parallel to the same.

The control and/or regulating system 1 is set up such that the light emitting diodes D1, D2 have a desired luminance in the light emitting diode field 2. In this respect, it is possible that no light emitting diode D1, D2 is switched on during a clock cycle. In the case of circuit arrangements 8 from the current state of technology, this could lead to misinterpretation. The switched-off light emitting diodes D1, D2 were wrongly recognized as defective light emitting diodes D1, D2 as the first voltage sensor 7 was connected to the first input 6 of the control and/or regulating system 1 and this value fell below a designated value for short circuit or fault detection.

In the present voltage arrangement 8, a constant voltage signal is present at the first input 6 of the control and/or regulating system 1. The voltage signal must be selected in such a way that it is in any case higher than the designated value for the internal short circuit or fault detection of the control and/or regulating system 1. For example, the constant voltage value can be around 3V.

In order to be still able to perform a short-circuit or fault detection, the signal from the first voltage sensor 7 is transferred to the first input of the detector 11. The signals transferred to the detector 11 via the second input as to which light emitting diodes D1, D2 are switched on within a clock cycle can be used to calculate a target value for the drop in voltage across the light emitting diode field 2, which is set when all light emitting diodes D1, D2 in the light emitting diode field 2 are fault free. The target value for the drop in voltage is then compared with the signal from the first voltage sensor 7. If there are deviations between the two values, the detector 11 transmits via its output a signal to the control and/or regulating system 1. The control and/or regulating system 1 can transmit the signal as a fault message of a short circuit or defect and via the second output transmits a signal to the controllable and/or regulatable power source 5 to switch off the same. Thanks to the detector 11, the short circuit or fault detection is maintained. Misinterpretations due to pulse width modulation are avoided.

LIST OF REFERENCE NUMBERS

1 Control and/or regulating system
2 LED field
3 First output of the control and/or regulating system
4 Second output of the control and/or regulating system
5 Controllable and/or regulatable power source
6 First Input of the control and/or regulating system
7 First voltage sensor
8 Circuit arrangement
9 Voltage source
10 Second voltage sensor
11 Detector
12 Supply voltage

We claim:

1. A method for operating a control and/or regulating system for a light emitting diode field, wherein the control and/or regulating system includes at least two first outputs at which control signals for controlling controllable switch elements (S1, S2) of the light emitting diode field are tapped, and includes a second output at which a control and/or regulating signal for controlling and/or regulating a controllable and/or regulatable power source is tapped, and includes at least one first measuring signal input at which sensor signals from at least one first voltage sensor are applied, the method comprising:

measuring a voltage drop across the light emitting diode field via the at least one first voltage sensor;

when the measured voltage drop across the light emitting diode field falls below a designated voltage value, switching off the controllable and/or regulatable power source via the control and/or regulating signal of the control and/or regulating system;

wherein a constant voltage signal via a second voltage sensor is present at a second measuring signal input of the control and/or regulating system, wherein a voltage value of the constant voltage signal is larger than the designated voltage value.

2. A circuit arrangement comprising:

a light emitting diode field; and a control and/or regulating system for the light emitting diode field, wherein the control and/or regulating system includes:

at least two first outputs at which control signals for controlling controllable switch elements of the light emitting diode field are tapped, a second output at which a control and/or regulating signal for controlling and/or regulating a controllable and/or regulatable power source is tapped, at least one first measuring signal input at which sensor signals from at least one first voltage sensor are applied, wherein a voltage drop across the light emitting diode field is measured via the at least one first voltage sensor, and when the measured voltage drop across the light emitting diode field falls below a designated voltage value, the controllable and/or regulatable power source is switched off via the control and/or regulating signal of the control and/or regulating system, wherein the light emitting diode field includes at least two series connections (I, II) each including at least one light emitting diode (D1, D2) and a controllable switch element (S1, S2) in parallel with the at least one light emitting diode (D1, D2), wherein the controllable switch elements (S1, S2) are each connected to one of the at least two first outputs of the control and/or regulating system, and are each connected to the controllable and/or regulatable power source in series to the light emitting diode field, wherein the controllable and/or regulatable power source is connected to the second output of the control and/or regulating system, wherein the circuit arrangement includes at least one voltage source and a second voltage sensor for detecting a fall in voltage of the at least one voltage source, wherein the second voltage sensor is connected to a second measuring signal input of the control and/or regulating system to transfer the detected fall in voltage of the at least one voltage source to the second measuring signal input, and wherein the at least one voltage source supplies a voltage signal having a voltage value that is larger than the designated voltage value at which the control and/or regulating system switches off the controllable and/or regulatable power source.

3. The circuit arrangement in accordance with claim 2, wherein the circuit arrangement includes a detector, wherein the detector:

determines, within a clock cycle of the control and/or regulating signal, a target value for a drop in voltage for all switched-on light emitting diodes (D1, D2) of one of the at least two series connections (I, II), records an actual drop in voltage through the one of the at least two series connections (I, II), and in the event of the actual drop in voltage being smaller than the target value for the drop in voltage for all switched-on light emitting diodes (D1, D2) of the one of the at least two series connections (I, II), transfers a signal to the control and/or regulating system.

4. The circuit arrangement in accordance with claim 3, wherein the detector is a microcontroller and/or comparator.

5. The circuit arrangement in accordance with claim 3, wherein the detector is used to separately detect the drop in voltage across each of the at least two series connections (I, II) of the light emitting diode field.

6. A method for operating the circuit arrangement in accordance with claim 2, the method comprising:

actuating the controllable switch elements (S1, S2) via the control and/or regulating system for opening and/or closing, supplying, via the at least one voltage source, the voltage signal at the second voltage sensor having the voltage value that is larger than the designated voltage value at which the control and/or regulating system switches off the controllable and/or regulatable power source, transferring, via the second voltage sensor that is connected to the second measuring signal input of the control and regulating system, a measuring signal of the drop in voltage of the at least one voltage source to the second measuring signal input.

7. The method in accordance with claim 6, wherein a detector within a clock cycle of the control and/or regulating signal:

determines a target value for a drop in voltage for all switched-on light emitting diodes (D1, D2) of one of the at least two series connections (I, II), detects an actual drop in voltage through the one of the at least two series connections (I, II), and when the actual drop in voltage is smaller than the target value for the drop in voltage for all switched-on light emitting diodes (D1, D2) of the one of the at least two series connections (I, II), transfers a signal to the control and/or regulating system.

8. A method for operating a control and/or regulating system for a light emitting diode field, the method comprising:

providing at least two first outputs associated with the control and/or regulating system, at which control signals for controlling controllable switch elements (S1, S2) of the light emitting diode field are tapped, providing a second output associated with the control and/or regulating system, at which a control and/or regulating signal for controlling and/or regulating a controllable and/or regulatable power source is tapped, providing at least one first measuring signal input associated with the control and/or regulating system at which sensor signals from at least one first voltage sensor are applied, where a voltage drop across the light emitting diode field is measured via the at least one first voltage sensor and when the measured voltage drop falls below a designated voltage value the controllable and/or regulatable power source is switched off via the control and/or regulating signal of the control and/or regulating system, wherein a constant voltage signal via a second voltage sensor is present at a second measuring signal input of the control and/or regulating system, wherein a voltage value of the constant voltage signal is larger than the designated voltage value.

* * * * *